(12) United States Patent
Trivedi et al.

(10) Patent No.: US 6,844,601 B2
(45) Date of Patent: Jan. 18, 2005

(54) LOCAL INTERCONNECT STRUCTURE FOR INTEGRATED CIRCUIT DEVICES, SOURCE STRUCTURE FOR THE SAME, AND METHOD FOR FABRICATING THE SAME

(75) Inventors: Jigish D. Trivedi, Boise, ID (US); Michael P. Violette, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/000,479

(22) Filed: Oct. 24, 2001

(65) Prior Publication Data

US 2002/0055251 A1 May 9, 2002

Related U.S. Application Data

(62) Division of application No. 09/055,056, filed on Apr. 3, 1998, now Pat. No. 6,403,458.

(51) Int. Cl.[7] .......................... H01L 29/76; H01L 29/94; H01L 23/48
(52) U.S. Cl. ...................... 257/383; 257/384; 257/763; 257/770
(58) Field of Search ................................. 257/377, 382, 257/383, 384, 412, 413, 915; 438/300, 585, 587, 588, 592

(56) References Cited

U.S. PATENT DOCUMENTS

| 4,753,851 A | 6/1988 | Roberts et al. | |
| 4,975,756 A | 12/1990 | Haken et al. | 257/371 |
| 5,124,280 A | 6/1992 | Wei et al. | 438/618 |
| 5,173,450 A | 12/1992 | Wei | 438/620 |
| 5,196,360 A | 3/1993 | Doan et al. | |
| 5,341,016 A | 8/1994 | Prall et al. | 257/412 |
| 5,391,520 A | 2/1995 | Chen et al. | 438/620 |
| 5,451,545 A | 9/1995 | Ramaswami et al. | 438/649 |
| 5,597,744 A | 1/1997 | Kamiyama et al. | 438/285 |
| 5,654,575 A | 8/1997 | Jeng | 257/384 |
| 5,766,997 A | 6/1998 | Takeuchi | 438/257 |
| 5,981,380 A | 11/1999 | Trivedi et al. | 438/639 |

FOREIGN PATENT DOCUMENTS

JP          5-152449          6/1993

OTHER PUBLICATIONS

T. Tang, et al., *Titanium Nitride Local Interconnect Technology for VLSI*, IEEE Trans. Electron Devices, vol. ED–34, 3 (1987) p. 682.

*Primary Examiner*—Hung Vu
(74) *Attorney, Agent, or Firm*—TraskBritt

(57) ABSTRACT

A process for making a local interconnect and the structures formed thereby. The process is practiced by forming a Ti layer having a nitrogen-rich upper portion over a portion of a substrate, forming a refractory metal layer on the Ti layer, forming a Si layer on the refractory metal layer, removing a portion of the Si layer, and heating to form a local interconnect structure. During this process, a source structure for the local interconnect is formed. This source structure comprises a Ti layer having a nitrogen-rich upper portion overlying a portion of a substrate, a refractory metal layer overlying the Ti layer, and a silicon layer overlying the refractory metal layer. The resulting local interconnect comprises a titanium silicide layer disposed on a portion of a substrate, a nitrogen-rich Ti layer disposed on the titanium silicide layer, and a refractory metal silicide layer disposed on the nitrogen-rich Ti layer. The local interconnect is especially useful for reducing cratering and consumption of silicon regions underlying the local interconnect.

11 Claims, 4 Drawing Sheets

US 6,844,601 B2

LOCAL INTERCONNECT STRUCTURE FOR INTEGRATED CIRCUIT DEVICES, SOURCE STRUCTURE FOR THE SAME, AND METHOD FOR FABRICATING THE SAME

CROSS REFERENCE TO RELATED APPLICATION

This application is a divisional of application Ser. No. 09/055,056, filed Apr. 3, 1998, pending.

BACKGROUND OF THE INVENTION

1. Field of the Invention

This invention relates generally to the field of integrated circuit design and fabrication. Specifically, the invention relates to methods for making local interconnect structures for integrated circuit devices and the structures formed thereby.

2. State of the Art

Integrated circuits (ICs) contain individual devices which are interconnected during fabrication by an intricate network of conductive material. The quality of these interdevice interconnections in part determines the performance and reliability of the overall IC device.

Local interconnects, unlike other interconnects such as multi-level interconnects, electrically connect individual devices of the overall IC device at a level or levels below customary metallization levels. For example, local interconnects connect gates and emitters to diffusion areas and N+ and P+ regions across field oxide regions, thereby increasing the packing density. See T. Tang et al., *Titanium Nitride Local Interconnect Technology for VLSI*, IEEE Trans. Electron Devices, Vol. ED-34, 3 (1987) p. 682, incorporated herein by reference.

Numerous materials have been employed in local interconnects. These local interconnect materials include titanium nitride and refractory metals, as well as titanium silicide ($TiSi_x$). $TiSi_x$ has been used as a local interconnect material because of its low resistance and high conductivity. However, the quality of local interconnects formed from these materials varies.

Several techniques for fabricating $TiSi_x$ local interconnects are described in U.S. Pat. Nos. 4,975,756, 5,124,280, and 5,173,450, all incorporated herein by reference. Another technique of fabricating $TiSi_x$ local interconnects is disclosed in U.S. Pat. No. 5,654,575, incorporated herein by reference. This latter patent describes titanium silicide interconnect straps which are formed from a silicon-on-titanium bilayer that has been deposited over a titanium nitride (TiN) layer. The TiN layer is formed by depositing a titanium (Ti) layer and then annealing in a nitrogen ambient, thereby nitriding the whole Ti layer. No Ti is left underlying the TiN layer.

Using titanium silicide as a local interconnect material can result in several problems, as explained in U.S. Pat. No. 5,341,016, incorporated herein by reference. One problem is that titanium silicide severely agglomerates when exposed to high temperatures such as 850° C. Agglomeration can increase both silicided source/drain and polycide sheet resistances and lead to excessive leakage and/or gate oxide degradation. Another problem with titanium silicide is diffusion of the titanium material into underlying silicon regions during heating, which allows titanium-rich $TiSi_x$ to consume active areas in the silicon.

A particular problem with titanium silicide has been cratering exhibited during local interconnect formation. When Ti and silicon (Si) are sequentially deposited in a via or hole (such as a trench formed between gate electrodes) and reacted to form an interconnect, sufficient amounts of Si do not migrate to the bottom of the trench to react with the Ti located there. Because of the lack of overlying Si volume at the bottom of the trench, the Ti instead reacts with underlying regions of the silicon substrate and causes craters in these regions. This cratering can reduce the performance of the IC device by increasing the current leakage.

SUMMARY OF THE INVENTION

The present invention relates to a method for making a local interconnect structure by forming a Ti layer having a nitrogen-rich upper portion over a portion of a substrate, forming a refractory metal layer on the Ti layer, forming a Si layer on the refractory metal layer, removing a portion of the Si layer, and then heating to form a structure. The nitrogen-rich Ti layer may be formed by depositing Ti in a nitrogen atmosphere, or by depositing a Ti layer and either annealing in a nitrogen-containing atmosphere or ion implanting nitrogen.

The present invention also relates to a source structure for a local interconnect. The source structure comprises a Ti layer having a nitrogen-rich upper portion overlying a portion of a substrate, a refractory metal layer overlying the Ti layer, and a Si layer overlying the refractory metal layer. The lower portion of the Ti layer preferably contains substantially no nitrogen. The nitrogen-rich upper portion of the Ti layer preferably extends along the upper surface of the Ti layer. The refractory metal is preferably Ti and the Si layer is preferably amorphous silicon.

The present invention also relates to a local interconnect structure. The local interconnect structure comprises a titanium silicide layer disposed over a portion of a substrate, a nitrogen-rich Ti layer disposed on the titanium silicide layer, and a refractory metal silicide layer disposed on the nitrogen-rich Ti layer. The titanium silicide layer is preferably disposed over active areas of the substrate. The refractory metal is preferably Ti.

The present invention produces several advantages when compared to the prior art. The present invention reduces cratering and consumption of Si regions underlying the local interconnect structure because unconsumed Ti is not available to react with the Si regions during later heat treatments. Subsequent processing, therefore, can proceed at higher temperatures. Another advantage is that less current will leak to the substrate because smaller craters in the underlying Si substrate permit less current to leak. The present invention also forms a more continuous silicide interconnect because greater amounts of the Ti react with Si to form the local interconnect. The more continuous local interconnect, in turn, produces less break-through of overlying metal layers which contact the local interconnect.

BRIEF DESCRIPTION OF THE SEVERAL VIEWS OF THE DRAWINGS

The present invention is illustrated in part by the accompanying drawings in which.

DETAILED DESCRIPTION OF THE INVENTION

This invention provides a local interconnect for integrated circuits and semiconductor devices. In particular, the local interconnects of the invention can be used in CMOS logic devices, especially SRAM devices. The local interconnects described below exemplify the inventive process and structure in a CMOS logic device. However, the inventive process and structure could be modified for any desired device.

The following description provides specific details such as material thicknesses and types in order to provide a thorough understanding of the present invention. The skilled artisan, however, would understand that the present invention may be practiced without employing these specific details. Indeed, the present invention can be practiced in conjunction with fabrication techniques conventionally used in the industry.

The process steps and structures described below do not form a complete process flow for manufacturing IC devices or a completed device. Only the process steps and structures necessary to understand the present invention are described below.

Figure 1:
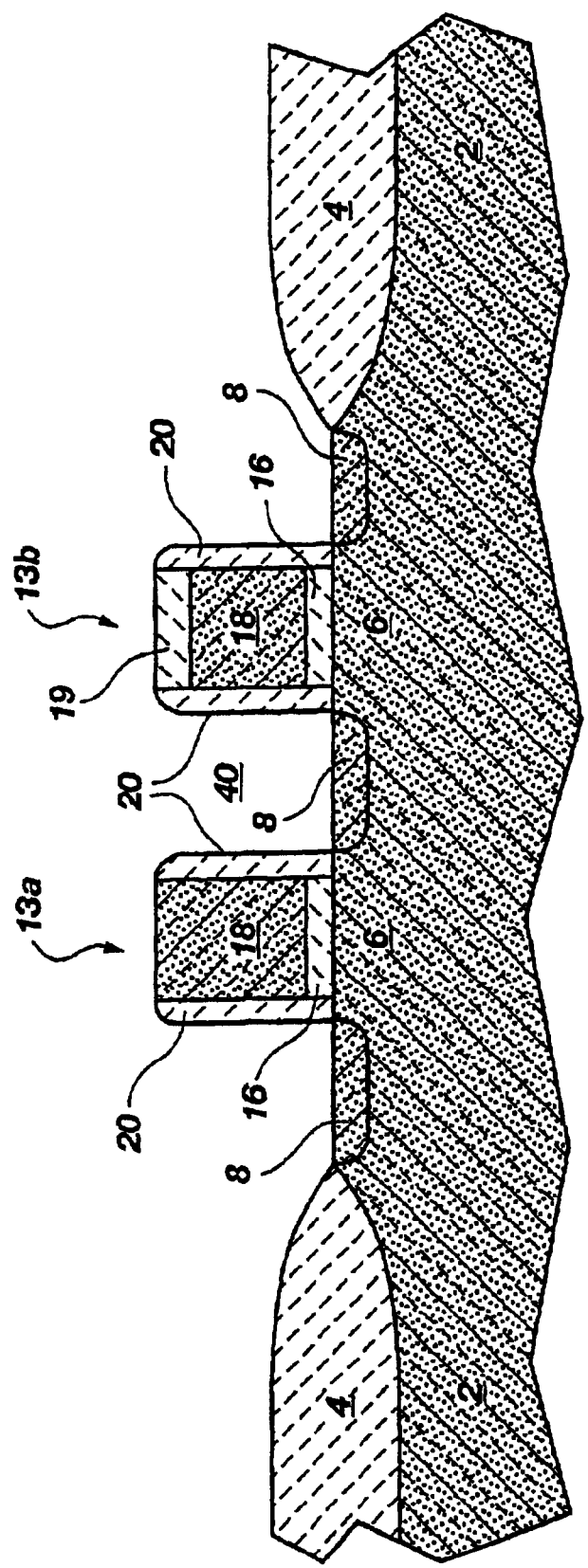
FIGS. 1–4 comprise cross-sectional views in a process of forming a local interconnect, and the structure formed thereby, according to the present invention.

FIG. 1 illustrates a structure resulting from part of a process of the present invention. In FIG. 1, device isolation regions 4 (e.g., field oxide regions) are formed in substrate 2 to define moat region 6 where devices, such as transistors, will be formed. Substrate 2 may be any surface suitable for device formation, such as a semiconductor wafer, and may be doped and/or include an epitaxial layer. Preferably, substrate 2 is a silicon wafer or a bulk silicon region, such as a silicon-on-insulator or silicon-on-sapphire structure. Device isolation regions 4 may be field oxide regions, but the present invention can be practiced using other isolation technologies.

A dielectric layer is then formed over substrate 2. This dielectric layer isolates the overlying gate electrode, as described below, from the upper surface of substrate 2. Accordingly, any dielectric material suitable for such a purpose can be employed as this dielectric layer. Preferably, this dielectric layer is a silicon oxide layer.

Next, a conductive layer is deposited. Since this conductive layer will form the gate electrode, as described below, any suitable gate electrode material may be employed. Preferably, this conductive layer is a doped polysilicon layer. Optionally, a a second conductive layer with a lower resistance and melting point, such as tungsten silicide, may be deposited over the polysilicon layer. A second dielectric layer may optionally be formed over this conductive layer. This second dielectric layer preferably comprises silicon oxide or silicon nitride. More preferably, this second dielectric layer is silicon oxide.

The conductive layer, first dielectric layer, and second dielectric layer (if present) are then patterned and etched to form gate structures 13a and 13b flanking trench 40. Gate structures 13a and 13b comprise gate dielectric 16, gate electrode 18, and, if desired, second gate dielectric 19. Sidewall spacers 20 for the gate structures are then formed by depositing a dielectric layer overall and etching to leave substantially vertical sidewall spacers 20. Preferably, this dielectric layer comprises silicon oxide or silicon nitride. More preferably, this dielectric layer is silicon oxide. When second gate dielectric 19 is present, gate electrode 18 may be exposed by removing a portion of second gate dielectric 19 by a suitable patterning and etching process.

Diffusion regions 8, such as source/drain regions, are then formed in substrate 2. Diffusion regions 8 can be formed by implanting a suitable dopant, such as B, As, or P, at an energy and dose sufficient to form the desired dopant concentration. Diffusion regions 8 may optionally be formed by implanting the dopants through a dielectric layer.

Figure 2:
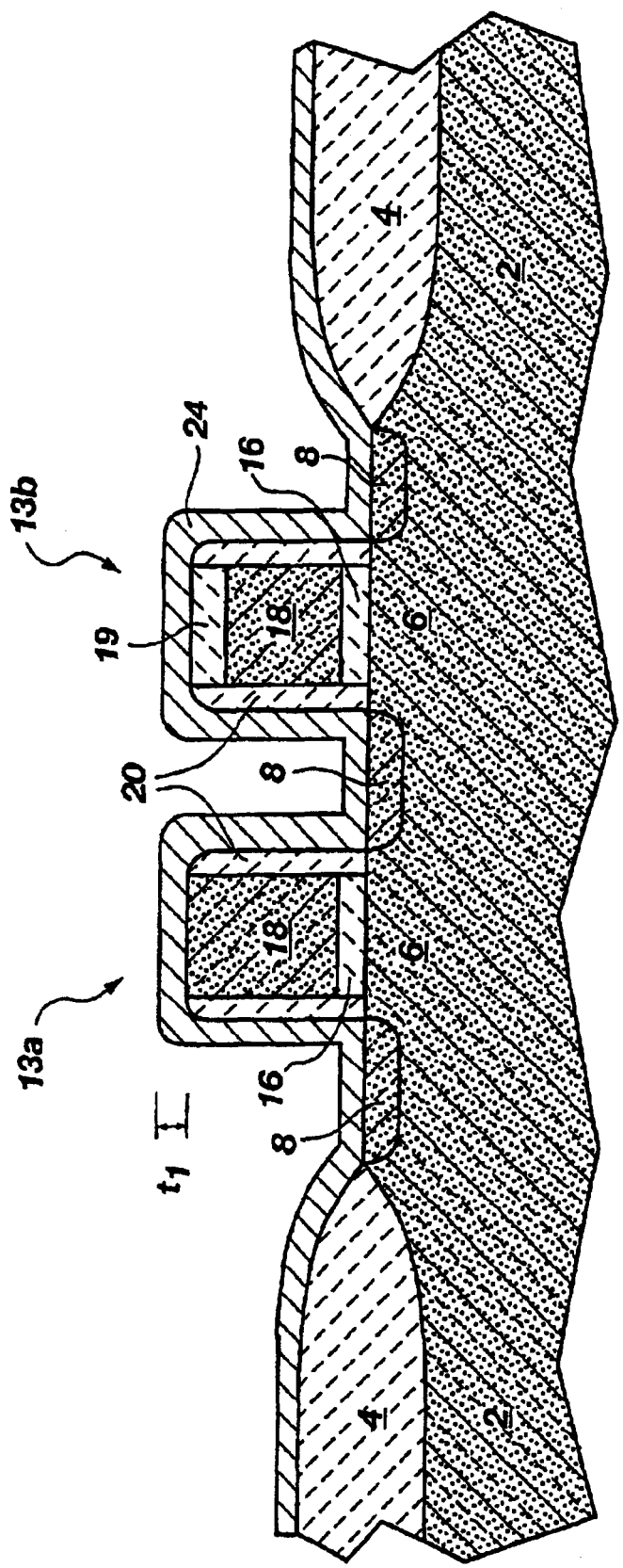

Referring to FIG. 2, layer 24 of Ti is then deposited or otherwise formed to a thickness of $t_1$. Thickness $t_1$ depends both on the device characteristics, such as the desired active area sheet resistance, and desired drive current. Thickness $t_1$ also depends on the amount of Ti necessary to silicide underlying portions of silicon substrate 2, as explained below. For example, Ti layer 24 may be deposited to a thickness $t_1$ ranging from about 100 to about 300 Å. Preferably, Ti layer 24 is deposited to a thickness $t_1$ of about 150 Å.

Ti layer 24 may be formed by any process imparting the desired physical and chemical characteristics to the layer. Preferably, Ti layer 24 is formed by a sputter deposition process, such as sputter deposition using a Ti target in a vacuum containing Ar.

Ti layer 24 may be a titanium compound or alloy since the layer need not be pure titanium. For example, alloying elements or other metals may be introduced into Ti layer 24 to provide better physical and chemical properties. Preferably, substantially pure Ti metal is employed as Ti layer 24.

Figure 3:
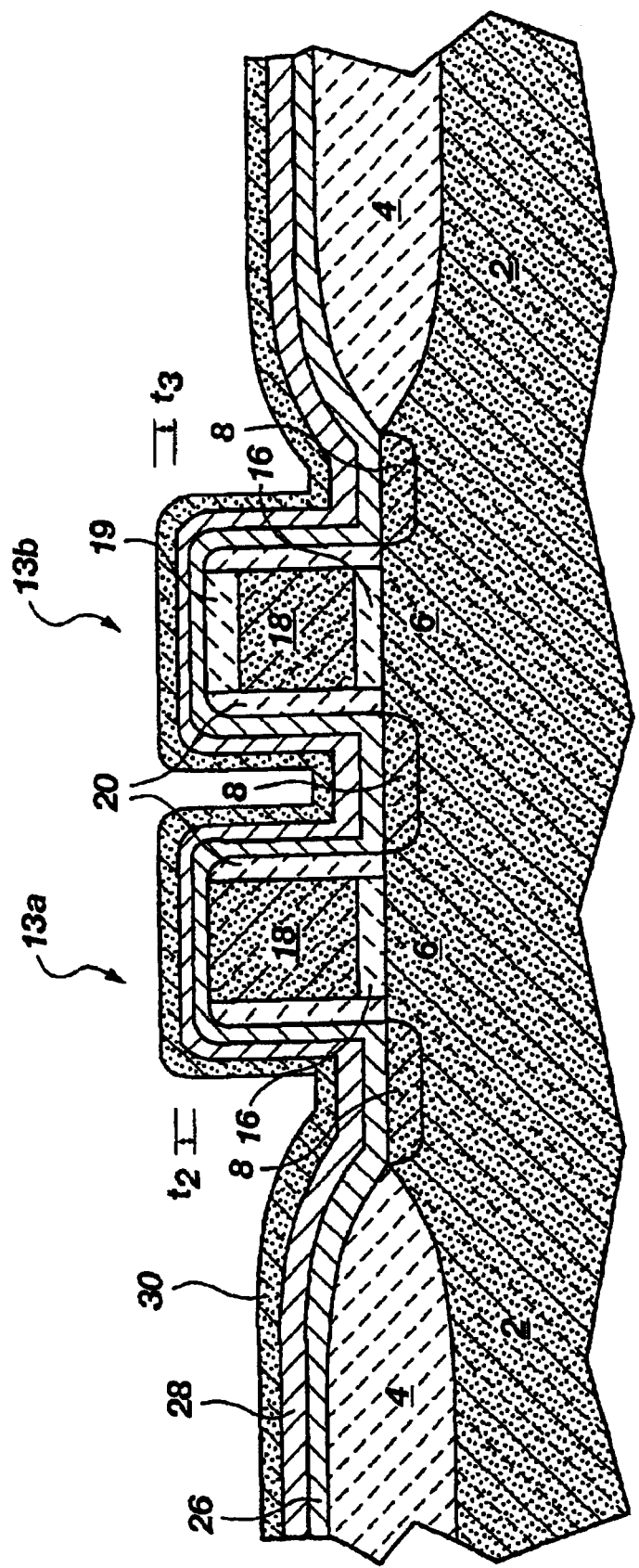

An upper portion of Ti layer 24 is then converted to contain a nitrogen-rich region. In one embodiment, this conversion is performed by annealing Ti layer 24 with a nitrogen-containing atmosphere in a sputter chamber or in a separate rapid thermal process (RTP) chamber. The annealing process yields a nitrogen-rich region of about 50 Å to about 100 Å in an upper portion of Ti layer 24, which preferably extends along the entire upper surface of Ti layer 24, yet does not appreciably extend into a lower portion of Ti layer 24. The converted titanium layer containing this nitrogen-rich upper portion is depicted in FIG. 3 as nitrogen-rich Ti layer 26. Nitrogen-rich Ti layer 26, therefore, contains a lower titanium portion and an upper portion of nitrogen-rich titanium.

The above annealing process is performed for a time and at a temperature sufficient to convert the upper portion of the Ti layer 24 to a nitrogen-rich region, thereby forming nitrogen-rich Ti layer 26. For example, the temperature ranges from about 400 to about 600° C., and is preferably about 450° C. The time ranges from about 15 to about 60 seconds, and is preferably about 30 seconds.

The nitrogen-containing atmosphere for the annealing process comprises a gas or a mixture of gases containing nitrogen. Examples of such gases include nitrogen, ammonia, or mixtures thereof. The annealing atmosphere may contain other gases, such as argon or hydrogen. Preferably, the nitrogen-containing atmosphere contains substantially pure nitrogen gas.

Nitrogen-rich Ti layer 26 may also be formed by another process. In this other process, Ti layer 24 is formed as discussed above. Rather than annealing Ti layer 24, however, nitrogen ions are implanted into an upper portion of Ti layer 24 to form the nitrogen-rich region. Any implantation process can be used to implant nitrogen ions into the upper portion of Ti layer 24, provided it does not degrade Ti layer 24. The energy and time of the implantation are selected to obtain the desired depth of the nitrogen-rich region.

Nitrogen-rich Ti layer 26 may be formed by yet another process. In this process, nitrogen-rich Ti layer 26 is formed in a single step on substrate 2 and gate structures 13a and 13b by depositing Ti in an atmosphere comprising N. Preferably, this process is a Ti sputter deposition process, such as sputter deposition in a vacuum containing Ar and N. The amount of nitrogen in the nitrogen-rich Ti layer 26 can be controlled by controlling the nitrogen concentration in the sputtering atmosphere. The depth of the nitrogen-rich upper portion of the Ti layer can be controlled when the nitrogen is introduced into the sputtering atmosphere. The lower titanium portion of nitrogen-rich Ti layer 26 can be formed by sputtering in an Ar atmosphere, with nitrogen being introduced into the sputtering atmosphere while depositing the upper portion.

This nitrogen-rich region is believed to not be pure titanium nitride. The term "nitrogen-rich" refers to varying amounts of nitrogen. For example, the concentration of nitrogen in the nitrogen-rich region may range from about 2% to about 15%, and preferably about 5%.

As shown in FIG. 3, refractory metal layer 28 is then deposited or otherwise formed on nitrogen-rich Ti layer 26 to a thickness $t_2$. Thickness $t_2$ depends on at least three factors: first, the device characteristics, such as desired active area sheet resistance and desired drive current; second, the thickness of the desired local interconnect since refractory metal layer 28 will be later silicided to form part of the local interconnect; and third, the thickness of the overlying Si layer since the refractory metal layer 28 should be thick enough to completely react with all of the overlying silicon to form a silicide layer. Refractory metal layer 28 may be deposited to a thickness similar to thickness $t_1$. Preferably, refractory metal layer 28 is deposited to a thickness $t_2$ ranging from about 100 to about 300 Å. More preferably, refractory metal layer 28 is deposited to a thickness $t_2$ of about 150 Å.

Refractory metal layer 28 may be formed by any process imparting the necessary physical and chemical characteristics to the layer, such as a suitable CVD or PVD process. Preferably, refractory metal layer 28 is formed by sputter deposition in a vacuum containing Ar. Refractory metal layer 28 may comprise any refractory metal, alloy, or compound which forms a silicide when reacted with silicon, such as Co or Ti, or mixtures or alloys thereof. Preferably, refractory metal layer 28 is Ti.

Still referring to FIG. 3, silicon layer 30 is next deposited over refractory metal layer 28 to form a source structure for a local interconnect. Preferably, silicon layer 30 is amorphous silicon. Si layer 30 may be deposited or otherwise formed by any process preventing formation of oxide on refractory metal layer 28, such as depositing the silicon in the same vacuum apparatus as refractory metal layer 28. Preferably, Si layer 30 is sputter deposited in an argon atmosphere. Optionally, Si layer 30 may be doped with a suitable dopant.

Si layer 30 is deposited to a thickness of $t_3$. Thickness $t_3$ depends on the device characteristics mentioned above, as well as the thickness of the desired local interconnect structure since Si layer 30 will react with refractory metal layer 28 to form part of the local interconnect structure. Thickness $t_3$ also depends on the stoichiometric ratio of Si needed to react with refractory metal layer 28. Preferably, Si layer 30 is deposited to a thickness ranging from about 400 to about 1000 Å and, and, more preferably, to a thickness $t_3$ of about 600 Å.

Figure 4:
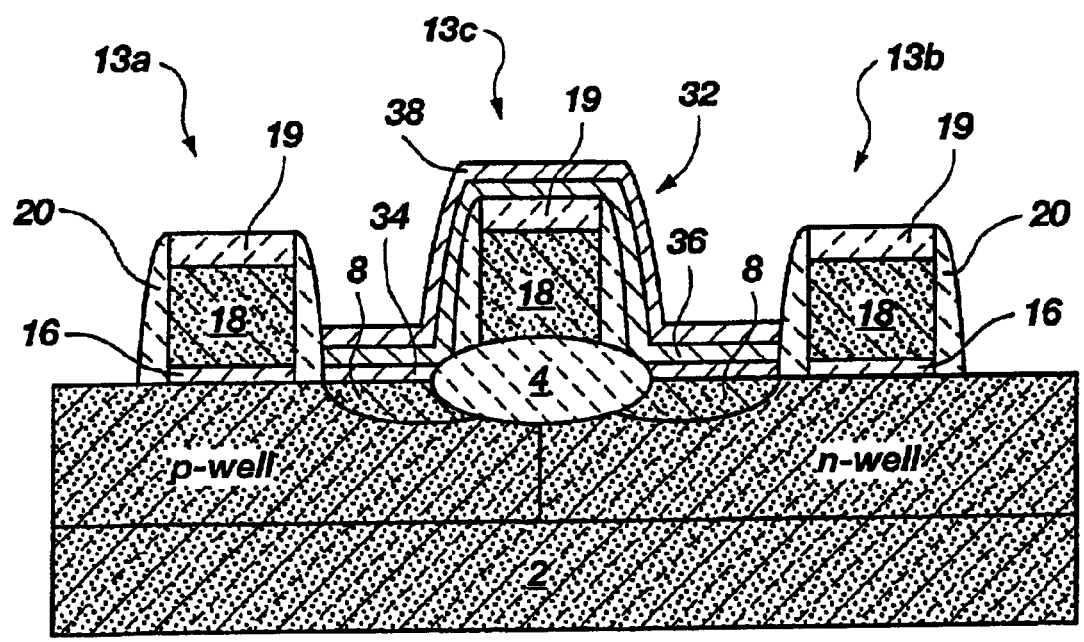

A portion of silicon layer 30 is then removed. The remaining portion of silicon layer 30 reacts with refractory metal layer 28 to form part of the silicide interconnect structure connecting the desired areas of the IC device. For example, for a preferred IC device depicted in FIG. 4 (which differs from the devices in FIGS. 1–3 by containing an additional gate structure 13c overlying isolation region 4 and between gate structures 13a and 13b), local interconnect structure 32 could be formed overlying gate structure 13c to connect diffusion regions 8. Accordingly, those portions of silicon layer 30 not required for forming local interconnect structure 32, i.e., portions overlying gate structures 13a and 13b, are removed. The undesired portions of silicon layer 30 are preferably removed by a photolithographic patterning and etch process, such as by depositing a resist layer, developing the resist layer to form the desired pattern, etching to remove the exposed portions of Si layer 30, with the etch stopping on refractory metal layer 28, and then removing the resist layer.

A rapid thermal process (RTP) is then employed to form local interconnect structure 32 comprising titanium silicide layer 34 over silicon substrate 2 and exposed gate electrode 18 (if no dielectric layer 19 has been formed), nitrogen-rich titanium layer 36 on titanium silicide layer 34, and refractory metal silicide layer 38 on nitrogen-rich titanium layer 36. The RTP may be performed in nitrogen, ammonia, or argon for a time and at a temperature sufficient to cause refractory metal layer 28 to react with Si layer 30 and form refractory metal silicide layer 38, as well as cause the lower titanium portion of nitrogen-rich Ti layer 26 to react with substrate 2 (and gate electrode 18 when exposed) and form titanium silicide layer 34, leaving the nitrogen-rich upper portion of nitrogen-rich Ti layer 26 unchanged (designated as nitrogen-rich titanium layer 36 in FIG. 4). For example, the RTP could be performed for about 15 to about 90 seconds, and preferably about 30 seconds, at about 600° C. to about 700° C., and preferably about 650° C. The RTP may optionally be performed as a transient heating step, such as by using a flash lamp or laser heating.

The thickness of local interconnect structure 32 depends on the time and temperature of the RTP. The RTP, therefore, should be performed until the desired thickness is obtained and most, if not substantially all, of silicon layer 30 is consumed. The thickness of local interconnect structure 32, and therefore the length and temperature of RTP, must be selected carefully because of the adverse problems (e.g., dopant segregation and aggregation) that can occur during subsequent high-temperature processing.

Removing portions of silicon layer 30 will expose portions of nitrogen-rich Ti layer 26, which may optionally be removed prior to further processing of the IC device. Any process which removes portions of nitrogen-rich Ti layer 26 without removing or adversely affecting local interconnect 32 can be used. Preferably, a wet etch solution that does not react with local interconnect structure 32 can be used. More preferably, a wet etch solution containing about 5 parts $H_2O$, about 0.25 to about 1 part $H_2O_2$, and about 0.25 to about 1 part $NH_4OH$ is used to remove the desired portions of nitrogen-rich Ti layer 26.

An optional high-temperature anneal may be performed to reduce the interconnect sheet resistivity. This high-temperature anneal may be performed at 750–875° C. for about 15 to about 60 minutes in an argon atmosphere. The high-temperature anneal could also be a rapid thermal anneal for about 30 seconds at 700–800° C.

Subsequent processing steps may now be undertaken to form the desired IC device. For example, a dielectric layer could be deposited, contact holes formed in the dielectric layer, and a patterned metal layer formed to achieve a desired pattern of electrical interconnections.

While the preferred embodiments of the present invention have been described above, the invention defined by the appended claims is not to be limited by particular details set forth in the above description, as many apparent variations thereof are possible without departing from the spirit or scope thereof.

What is claimed is:

1. A source structure for a local interconnect, comprising:

a semiconductor substrate;

a nitrogen-rich Ti layer having a nitrogen-rich upper portion and a titanium lower portion, wherein the nitrogen-rich upper portion is not pure titanium nitride, the titanium lower portion is substantially nitrogen-free, and the nitrogen-rich Ti layer overlies a portion of the semiconductor substrate;

a refractory metal layer overlying the nitrogen-rich Ti layer; and a silicon layer overlying the refractory metal layer.

2. The structure of claim 1, wherein the semiconductor substrate is a silicon substrate.

3. The structure of claim 2, wherein the nitrogen-rich Ti layer is disposed over active areas in the silicon substrate.

4. The structure of claim 1, wherein the nitrogen-rich upper portion extends along an upper surface of the nitrogen-rich Ti layer.

5. The structure of claim 1, wherein the titanium lower portion of the nitrogen-rich Ti layer contains substantially no nitrogen.

6. The structure of claim 1, wherein a thickness of the nitrogen-rich upper portion ranges from about 50 Å to about 100 Å.

7. The structure of claim 1, wherein a thickness of the nitrogen-rich Ti layer ranges from about 100 Å to about 300 Å.

8. The structure of claim 1, wherein the refractory metal layer comprises Co or Ti.

9. The structure of claim 8, wherein the refractory metal layer comprises Ti.

10. The structure of claim 1, wherein a thickness of the refractory metal layer ranges from about 100 Å to about 300 Å.

11. The structure of claim 1, wherein a thickness of the silicon layer ranges from about 400 Å to about 1000 Å.

* * * * *

UNITED STATES PATENT AND TRADEMARK OFFICE
CERTIFICATE OF CORRECTION

| | |
|---|---|
| PATENT NO. | : 6,844,601 B2 |
| APPLICATION NO. | : 10/000479 |
| DATED | : January 18, 2005 |
| INVENTOR(S) | : Jigish D. Trivedi and Michael P. Violette |

Page 1 of 1

It is certified that error appears in the above-identified patent and that said Letters Patent is hereby corrected as shown below:

COLUMN 6, LINES 44-45, change "interconnect 32" to --interconnect structure 32--

Signed and Sealed this

Sixth Day of November, 2007

JON W. DUDAS
*Director of the United States Patent and Trademark Office*